US012092673B2

(12) United States Patent
Makaroff

(10) Patent No.: US 12,092,673 B2
(45) Date of Patent: Sep. 17, 2024

(54) METHOD AND SYSTEM FOR OBTAINING SCATTERING AND RADIATION PROPERTIES OF ELECTRICALLY LARGE METAL TARGETS WITH GENERAL-PURPOSE FAST MULTIPOLE METHOD

(71) Applicant: Neva Electromagnetics, LLC, Yarmouth Port, MA (US)

(72) Inventor: Sergey N Makaroff, Holden, MA (US)

(73) Assignee: NEVA Electromagnetics, LLC, Yarmouth Port, MA (US)

( * ) Notice: Subject to any disclaimer, the term of this patent is extended or adjusted under 35 U.S.C. 154(b) by 574 days.

(21) Appl. No.: 16/890,310

(22) Filed: Jun. 2, 2020

(65) Prior Publication Data
US 2021/0373126 A1   Dec. 2, 2021

(51) Int. Cl.
*G06F 30/23*   (2020.01)
*G01R 29/08*   (2006.01)

(52) U.S. Cl.
CPC ............. *G01R 29/08* (2013.01); *G06F 30/23* (2020.01)

(58) Field of Classification Search
CPC ....... G01R 29/08; G06F 30/25; G06F 30/367; G06F 30/398; G06F 2111/00; G06F 2119/22; G06F 30/23
See application file for complete search history.

(56) References Cited

U.S. PATENT DOCUMENTS

| | | | | |
|---|---|---|---|---|
| 7,844,407 | B1* | 11/2010 | Shaeffer | G01R 29/0892 702/57 |
| 10,460,007 | B1* | 10/2019 | Zheng | G06F 17/16 |
| 2008/0027689 | A1* | 1/2008 | Jandhyala | G06F 30/20 703/2 |
| 2009/0046753 | A1* | 2/2009 | Petrescu-Prahova | H01S 5/2231 372/39 |
| 2017/0102623 | A1* | 4/2017 | Pisarenco | G01N 23/201 |
| 2017/0299643 | A1* | 10/2017 | Okhmatovski | G01R 29/08 |

OTHER PUBLICATIONS

D. Li, Z. Song, J. Hu, W. Hong, "Improving Combined Version of Current and Charge Integral Equation With Pyramid Shaped Functions", pp. 1630-1633, IEEE 2015 (Year: 2015).*
W. D. Li, Z. Song, J. Hu, W. Hong, "Improving Combined Version of current and charge Integral Eequation with Pyramid Shaped Function", pp. 1630-1633, IEEE 2015 (Year: 2015).*
J. M. Song, W. C. Chew, "fast Multipole Method Solution of Three Dimensional Integral Equation" pp. 1528-1531, 1995 IEEE (Year: 1995).*
Kolundzija, "Electromagnetic Modeling of Composite Metallic and Dielectric Structures" pp. 1021-1032, IEEE 1999 (Year: 1999).*

(Continued)

*Primary Examiner* — Kibrom K Gebresilassie
(74) *Attorney, Agent, or Firm* — Morris, Manning & Martin, LLP; Daniel E. Sineway, Esq.

(57) ABSTRACT

The present invention relates to a new accessible and accurate computational modeling approach to compute electromagnetic scattering and radiation from large predominantly metallic electrically large targets including but not limited to airplanes, missiles, and ships.

20 Claims, 9 Drawing Sheets

(56) References Cited

OTHER PUBLICATIONS

Makarov SN, Hamalainen M, Okada Y, Noetscher GM, Ahveninen J, Nummenmaa A. Boundary Element Fast Multipole Method for Enhanced Modeling of Neurophysiological Recordings. IEEE Trans. Biomed. Eng. Jun. 1, 2020. doi: 10.1109/TBME.2020.2999271, PubMed PMID: 32746015.

Makarov SN, Wartman WA, Daneshzand M, Fujimoto K, Raij T, Nummenmaa A. A software toolkit for TMS electric-field modeling with boundary element fast multipole method: An efficient MATLAB implementation. J Neural Eng. Aug. 4, 2020;17(4):046023. doi: 10.1088/1741-2552/ab85b3, PubMed PMID: 32235065.

Htet AT, Saturnino GB, Burnham EH, Noetscher G, Nummenmaa A, Makarov SN. Comparative performance of the finite element method and the boundary element fast multipole method for problems mimicking transcranial magnetic stimulation (TMS). J Neural Eng. Apr. 2019;16(2):024001. doi: 10.1088/1741-2552/aafbb9, PubMed PMID: 30605893, PubMed Central PMCID: PMC6546501.

Makarov SN, Noetscher GM, Raij T, Nummenmaa A. A Quasi-Static Boundary Element Approach with Fast Multipole Acceleration for High-Resolution Bioelectromagnetic Models. IEEE Trans Biomed Eng. Mar. 7, 2018. doi: 10.1109/ TBME.2018.2813261, PubMed PMID: 29993385; PubMed Central PMCID: PMC7388683.

Makarov SN, Noetscher GM, Nummenmaa A, eds. Brain and Human Body Modeling. vol. 2. Springer Nature, Aug. 2020. Open access. ISBN 978-3-030-45622-1.

Makarov SN, Noetscher GM, Horner M., eds. Brain and Human Body Modeling. vol. 1. Springer Nature, 2019. Open access. ISBN 978-3-030-21293-3, PubMed PMID: 31725207.

Makarov SN, Noetscher GM, Nazarian A. Low-Frequency Electromagnetic Modeling for Electrical and Biological Systems Using MATLAB, Wiley, New York 2015. 648 p. ISBN-10: 1119052564.

Makarov SN, Noetscher GM, Yanamadala J, Piazza MW, Louie S, Prokop A, Nazarian A, and Nummenmaa A. Virtual Human Models for Electromagnetic Studies and Their Applications. IEEE Rev Biomed Eng. 2017;10:95-121. doi: 10.1109/RBME.2017.2722420, PubMed PMID: 28682265.

\* cited by examiner

```
function LHS = function_LHS_MFIE(geom, I, k0)
    %% General FMM: input data
    nsource       = geom.FacesTotal;        %   # of source points (geom is a structure)
    srcinfo.sources = geom.CenterF';         %   source points [3, N] - face centers
    srcinfo.nd    = 3;                       %   three effective dipole sets
    targ          = geom.RWGCenter';         %   target points - edge centers
    zk            = norm(k0);                %   wavenumber (exp(+jkr) for Leslie's FMM)
    prec          = 2e-4;                    %   precision-->this value is OK for surfaces
    pg            = 0;                       %   nothing is evaluated at sources (collocation)
    pgt           = 1;                       %   potential is evaluated at targets
    %% Effective current approach (re-assembling summation and find currents/charges on facets)
    select        = I(geom.BFnumber);
    J(:, 1)       = 2*sum(geom.BFrhox.*select, 2);
    J(:, 2)       = 2*sum(geom.BFrhoy.*select, 2);
    J(:, 3)       = 2*sum(geom.BFrhoz.*select, 2);
    %% Three sets (M1, M2,M3) of effective dipole moments
    % M1-component
    temp1(:, 1)        = zeros(nsource, 1);
    temp1(:, 2)        = -J(:, 3);
    temp1(:, 3)        = +J(:, 2);
    % M2-component
    temp2(:, 1)        = +J(:, 3);
    temp2(:, 2)        = +zeros(nsource, 1);
    temp2(:, 3)        = -J(:, 1);
    % M3-component
    temp3(:, 1)        = -J(:, 2);
    temp3(:, 2)        = +J(:, 1);
    temp3(:, 3)        = +zeros(nsource, 1);
    srcinfo.dipoles(1, :, :)  = conj(temp1.');          %   first set of dipole moments
    srcinfo.dipoles(2, :, :)  = conj(temp2.');          %   second set of dipole moments
    srcinfo.dipoles(3, :, :)  = conj(temp3.');          %   third set of dipole moments
    U             = hfmm3d(prec, zk, srcinfo, pg, targ, pgt);  %   FMM for three sets
    Int           = conj(U.pottarg.');                  %   effective potentials for three sets
    LHS           = I.*geom.AngleCorrection - 1/(4*pi)*sum(Int.*geom.RWGevector, 2);  %   LHS of MFIE,
has the units of A/m
end
```

FIG. 5

```
function LHS= function_LHS_EFIE(geom, const, I, k0)
%% General FMM: input data
    nsource         = geom.FacesTotal;          %   # of source points (geom is a structure)
    srcinfo.sources = geom.CenterF';            %   source/target points [3, N] - face centers
    srcinfo.nd      = 4;                        %   four effective charge sets
    zk              = norm(k0);                 %   wavenumber (exp(+jkr) for Leslie's FMM)
    prec            = 2e-4;                     %   precision-->this value is OK for surfaces
    pg              = 1;                        %   potential is evaluated at sources
    pgt             = 0;                        %   nothing is evaluated at targets
    omega           = const.c*k0;
    IS              = geom.IS' - 1j*k0;
    %% Effective current approach (re-assembling summation and find currents/charges on facets)
    select  = I(geom.BFnumber);
    rhoA    = (1j/omega)*sum(geom.BFcharge.*select, 2).';
    JxA     = sum(geom.BFrhox.*select, 2).';
    JyA     = sum(geom.BFrhoy.*select, 2).';
    JzA     = sum(geom.BFrhoz.*select, 2).';
    %% Four sets of effective charges
    srcinfo.charges(1, :)   = conj(JxA);
    srcinfo.charges(2, :)   = conj(JyA);
    srcinfo.charges(3, :)   = conj(JzA);
    srcinfo.charges(4, :)   = conj(rhoA);
    U                       = hfmm3d(prec, zk, srcinfo, pg);
    %% Add potential integrals
    Phi = (1/(4*pi*const.epsilon))*(conj(U.pot(4, :)) + rhoA.*IS).';
    Ax  = (const.mu/(4*pi))*(conj(U.pot(1, :)) + JxA.*IS).';
    Ay  = (const.mu/(4*pi))*(conj(U.pot(2, :)) + JyA.*IS).';
    Az  = (const.mu/(4*pi))*(conj(U.pot(3, :)) + JzA.*IS).';
    %% Assembly the right-hand side back
    LHS  =        -1j*omega*( geom.FCRhoP(:, 1).*Ax(geom.TriP) + geom.FCRhoP(:, 2).*Ay(geom.TriP) +
geom.FCRhoP(:, 3).*Az(geom.TriP)     +...
                              geom.FCRhoM(:, 1).*Ax(geom.TriM) + geom.FCRhoM(:, 2).*Ay(geom.TriM) +
geom.FCRhoM(:, 3).*Az(geom.TriM))/2  +...
                              Phi(geom.TriP) - Phi(geom.TriM);
    LHS  = - LHS./geom.EdgeLength;   %   to be consistent with Z; LHS of EFIE has the units of volts per
meter
end
```

FIG. 6

```
function LHS = function_LHS(geom, const, I, k0, alpha, Precond)
    LHSH   = function_LHS_MFIE(geom, I, k0);
    LHSE   = function_LHS_EFIE(geom, const, I, k0);
    LHS    = alpha*LHSE + (1-alpha)*const.eta*LHSH;
    LHS    = LHS./Precond;
end function [I, flag, rres, its, resvec] = function_GMRES(geom, const, k0, V, IMFIE, alpha, res, iter)
    ZM                          = function_PRECOND_MFIE(geom);
    ZD                          = function_PRECOND_EFIE(geom, const, k0);
    Precond                     = alpha*ZD + (1-alpha)*const.eta*ZM;
    b                           = alpha*V + (1-alpha)*const.eta*IMFIE;
    b                           = b./Precond;
    MATVEC                      = @(I) function_LHS(geom, const, I, k0, alpha, Precond);
    [I, flag, rres, its, resvec] = gmres(MATVEC, b, [], res, iter, [], [], b);
end
```

FIG. 7

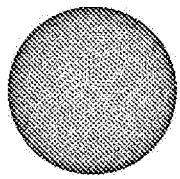

Number of facets in the sphere model

| 1316 | 2678 | 5810 | 11534 | 23516 | 47492 | 94160 | 206324 | 411608 | 995216 | 1866140 |
|---|---|---|---|---|---|---|---|---|---|---|
| 1316 | 2678 | 5810 | 11534 | 23516 | 47492 | 94160 | 206324 | 411608 | 995216 | 1866140 |
| 1316 | 2678 | 5810 | 11534 | 23516 | 47492 | 94160 | 206324 | 411608 | 995216 | 1866140 |
| 1316 | 2678 | 5810 | 11534 | 23516 | 47492 | 94160 | 206324 | 411608 | 995216 | 1866140 |
| 1316 | 2678 | 5810 | 11534 | 23516 | 47492 | 94160 | 206324 | 411608 | 995216 | 1866140 |
| 1316 | 2678 | 5810 | 11534 | 23516 | 47492 | 94160 | 206324 | 411608 | 995216 | 1866140 |
| 1316 | 2678 | 5810 | 11534 | 23516 | 47492 | 94160 | 206324 | 411608 | 995216 | 1866140 | ka of the sphere model

| 3.14 | 3.14 | 3.14 | 3.14 | 3.14 | 3.14 | 3.14 | 3.14 | 3.14 | 3.14 | 3.14 |
|---|---|---|---|---|---|---|---|---|---|---|
| 6.29 | 6.29 | 6.29 | 6.29 | 6.29 | 6.29 | 6.29 | 6.29 | 6.29 | 6.29 | 6.29 |
| 12.58 | 12.58 | 12.58 | 12.58 | 12.58 | 12.58 | 12.58 | 12.58 | 12.58 | 12.58 | 12.58 |
| 25.15 | 25.15 | 25.15 | 25.15 | 25.15 | 25.15 | 25.15 | 25.15 | 25.15 | 25.15 | 25.15 |
| 50.30 | 50.30 | 50.30 | 50.30 | 50.30 | 50.30 | 50.30 | 50.30 | 50.30 | 50.30 | 50.30 |
| 100.60 | 100.60 | 100.60 | 100.60 | 100.60 | 100.60 | 100.60 | 100.60 | 100.60 | 100.60 | 100.60 |
| 201.20 | 201.20 | 201.20 | 201.20 | 201.20 | 201.20 | 201.20 | 201.20 | 201.20 | 201.20 | 201.20 |

Number of facets(elements) per wavelength

| 23.30 | 33.22 | 48.92 | 68.90 | 98.39 | 139.83 | 196.88 | 291.59 | 411.84 | 640.56 | 877.30 |
|---|---|---|---|---|---|---|---|---|---|---|
| 11.65 | 16.61 | 24.46 | 34.45 | 49.19 | 69.91 | 98.44 | 145.79 | 205.92 | 320.28 | 438.65 |
| 5.82 | 8.31 | 12.23 | 17.22 | 24.60 | 34.96 | 49.22 | 72.90 | 102.96 | 160.14 | 219.32 |
| 2.91 | 4.15 | 6.11 | 8.61 | 12.30 | 17.48 | 24.61 | 36.45 | 51.48 | 80.07 | 109.66 |
| 1.46 | 2.08 | 3.06 | 4.31 | 6.15 | 8.74 | 12.30 | 18.22 | 25.74 | 40.04 | 54.83 |
| 0.73 | 1.04 | 1.53 | 2.15 | 3.07 | 4.37 | 6.15 | 9.11 | 12.87 | 20.02 | 27.42 |
| 0.36 | 0.52 | 0.76 | 1.08 | 1.54 | 2.18 | 3.08 | 4.56 | 6.43 | 10.01 | 13.71 |

Execution time in minutes to reach relative residual of 1e-3

| 0.04 | 0.03 | 0.05 | 0.12 | 0.21 | 0.72 | 1.15 | 4.42 | 7.40 | 30.98 | 56.44 |
|---|---|---|---|---|---|---|---|---|---|---|
| 0.01 | 0.03 | 0.05 | 0.11 | 0.20 | 0.58 | 0.97 | 3.41 | 5.81 | 23.52 | 42.97 |
| NA | 0.06 | 0.07 | 0.22 | 0.32 | 0.68 | 1.05 | 2.91 | 5.26 | 18.47 | 35.26 |
| NA | NA | NA | 0.35 | 0.42 | 1.03 | 1.82 | 3.54 | 5.60 | 15.64 | 28.96 |
| NA | NA | NA | NA | NA | 2.06 | 2.93 | 6.78 | 9.93 | 20.30 | 33.47 |
| NA | NA | NA | NA | NA | NA | NA | 14.86 | 18.54 | 40.07 | 57.95 |
| NA | NA | NA | NA | NA | NA | NA | NA | NA | 110.21 | 135.32 |

Number of iterations (+1) to reach relative residual of 1e-3

| 10 | 12 | 13 | 15 | 18 | 21 | 24 | 29 | 34 | 42 | 49 |
|---|---|---|---|---|---|---|---|---|---|---|
| 10 | 10 | 11 | 13 | 15 | 17 | 20 | 24 | 28 | 35 | 40 |
| NA | 11 | 11 | 12 | 13 | 15 | 17 | 20 | 24 | 29 | 34 |
| NA | NA | NA | 12 | 12 | 13 | 14 | 16 | 19 | 23 | 26 |
| NA | NA | NA | NA | NA | 14 | 14 | 15 | 17 | 20 | 23 |
| NA | NA | NA | NA | NA | NA | NA | 16 | 17 | 18 | 20 |
| NA | NA | NA | NA | NA | NA | NA | NA | NA | 20 | 21 |

Relative error in surface current distribution compared to analytical solution

| 0.0590 | 0.0395 | 0.0265 | 0.0192 | 0.0133 | 0.0092 | 0.0067 | 0.0045 | 0.0033 | 0.0023 | 0.0021 |
|---|---|---|---|---|---|---|---|---|---|---|
| 0.1139 | 0.0747 | 0.0498 | 0.0364 | 0.0253 | 0.0174 | 0.0125 | 0.0083 | 0.0059 | 0.0038 | 0.0031 |
| NA | 0.1497 | 0.0972 | 0.0701 | 0.0487 | 0.0333 | 0.0239 | 0.0158 | 0.0111 | 0.0071 | 0.0053 |
| NA | NA | NA | 0.1427 | 0.0964 | 0.0657 | 0.0468 | 0.0307 | 0.0215 | 0.0136 | 0.0101 |
| NA | NA | NA | NA | NA | 0.1391 | 0.0954 | 0.0617 | 0.0427 | 0.0269 | 0.0197 |
| NA | NA | NA | NA | NA | NA | NA | 0.1332 | 0.0885 | 0.0542 | 0.0393 |
| NA | NA | NA | NA | NA | NA | NA | NA | NA | 0.1194 | 0.0828 |

FIG. 8 a)

Number of facets in the sphere model

| 8042 | 16958 | 23660 | 32120 | 47544 | 64536 | 127796 |
|---|---|---|---|---|---|---|
| 8042 | 16958 | 23660 | 32120 | 47544 | 64536 | 127796 |
| 8042 | 16958 | 23660 | 32120 | 47544 | 64536 | 127796 |
| 8042 | 16958 | 23660 | 32120 | 47544 | 64536 | 127796 |
| 8042 | 16958 | 23660 | 32120 | 47544 | 64536 | 127796 |
| 8042 | 16958 | 23660 | 32120 | 47544 | 64536 | 127796 |
| 8042 | 16958 | 23660 | 32120 | 47544 | 64536 | 127796 |
| 8042 | 16958 | 23660 | 32120 | 47544 | 64536 | 127796 | ka of the almond model (largest dimension times k over two)

| 2.64 | 2.64 | 2.64 | 2.64 | 2.64 | 2.64 | 2.64 |
|---|---|---|---|---|---|---|
| 5.29 | 5.29 | 5.29 | 5.29 | 5.29 | 5.29 | 5.29 |
| 13.22 | 13.22 | 13.22 | 13.22 | 13.22 | 13.22 | 13.22 |
| 26.44 | 26.44 | 26.44 | 26.44 | 26.44 | 26.44 | 26.44 |
| 419.17 | 52.88 | 52.88 | 52.88 | 52.88 | 52.88 | 52.88 |
| 628.75 | 628.75 | 79.32 | 79.32 | 79.32 | 79.32 | 79.32 |
| 838.34 | 838.34 | 838.34 | 838.34 | 105.76 | 105.76 | 105.76 |
| 1047.92 | 1047.92 | 1047.92 | 1047.92 | 1047.92 | 132.20 | 132.20 |

Number of facets(elements) per wavelength

| 153.48 | 222.55 | 263.07 | 306.61 | 373.15 | 434.71 | 611.12 |
|---|---|---|---|---|---|---|
| 76.74 | 111.28 | 131.53 | 153.31 | 186.57 | 217.35 | 305.56 |
| 30.70 | 44.51 | 52.61 | 61.32 | 74.63 | 86.94 | 122.22 |
| 15.35 | 22.26 | 26.31 | 30.66 | 37.31 | 43.47 | 61.11 |
| 7.67 | 11.13 | 13.15 | 15.33 | 18.66 | 21.74 | 30.56 |
| 5.12 | 7.42 | 8.77 | 10.22 | 12.44 | 14.49 | 20.37 |
| 3.84 | 5.56 | 6.58 | 7.67 | 9.33 | 10.87 | 15.28 |
| 3.07 | 4.45 | 5.26 | 6.13 | 7.46 | 8.69 | 12.22 |

Execution time in minutes to reach relative residual of 1e-3

| 0.27 | 0.55 | 0.54 | 1.38 | 1.21 | 1.62 | 4.79 |
|---|---|---|---|---|---|---|
| 0.23 | 0.48 | 0.49 | 1.13 | 1.06 | 1.37 | 4.07 |
| 0.20 | 0.35 | 0.35 | 0.73 | 0.71 | 0.89 | 2.66 |
| 0.21 | 0.48 | 0.45 | 0.73 | 0.73 | 0.86 | 2.16 |
| NA | 0.81 | 0.84 | 1.27 | 1.69 | 1.94 | 3.16 |
| NA | NA | 1.62 | 2.14 | 2.68 | 3.02 | 4.22 |
| NA | NA | NA | NA | 4.23 | 4.79 | 6.57 |
| NA | NA | NA | NA | NA | 7.71 | 10.70 |

Number of iterations (+1) to reach relative residual of 1e-3

| 34 | 56 | 41 | 53 | 44 | 50 | 56 |
|---|---|---|---|---|---|---|
| 27 | 44 | 32 | 40 | 37 | 41 | 47 |
| 19 | 29 | 21 | 26 | 26 | 27 | 33 |
| 13 | 20 | 15 | 18 | 19 | 19 | 24 |
| NA | 14 | 13 | 14 | 15 | 16 | 18 |
| NA | NA | 12 | 13 | 14 | 15 | 16 |
| NA | NA | NA | NA | 13 | 14 | 15 |
| NA | NA | NA | NA | NA | 14 | 15 |

METHOD AND SYSTEM FOR OBTAINING SCATTERING AND RADIATION PROPERTIES OF ELECTRICALLY LARGE METAL TARGETS WITH GENERAL-PURPOSE FAST MULTIPOLE METHOD

FIELD OF THE INVENTION

The present invention relates to a new accessible and accurate computational modeling approach to compute electromagnetic scattering and radiation from large predominantly metallic electrically large targets including but not limited to airplanes, missiles, and ships.

BACKGROUND OF THE INVENTION

The solution of computational electromagnetics (CEM) problems for electrically large scatterer and radiation targets is of much interest to commercial as well as defense applications. Efficient and accurate CEM simulation enables, for example, a research engineer to visualize and optimize a radar cross-section of an airplane, a ship, or a missile on a computer, providing in many cases more information than can ever be measured in a laboratory or in situ.

Commonly used techniques for the analysis of electrically large metallic and dielectric scatterer and radiation targets are:
a) Wave reflection and Geometrical Optics (GO);
b) Diffraction, Geometrical Theory of Diffraction (GTD), and Uniform Theory of Diffraction (UTD);
c) Physical Optics (PO) approximation;
d) Full wave computational modeling with the Method of Moments accelerated with a Fast Multipole method.

The first three approaches are approximations that may introduce a significant error depending on target's size and complexity. The last approach commonly uses the Method of Moments or MoM. It is based on Electric Field Integral Equation (EFIE), Magnetic Field Integral Equation (MFIE), or Combined Field Integral Equation (CFIE). The MoM approach applies certain vector surface basis functions. Most common are the Rao-Wilton-Glisson (RWG) basis functions. Given the known excitation or incident electromagnetic field, the unknown surface current and charge distributions are expanded into these basis functions and a system of N linear algebraic equations is obtained for unknown expansion coefficients $c_m$, m=1, . . . , N. This dense system is commonly too large to be solved directly for electrically large targets, i.e. for targets whose size is much larger than a wavelength.

Therefore, an iterative method is commonly applied, which computes a matrix-vector product multiple times, depending on the number of iterations. This iterative method is often accelerated by a Fast Multipole Method, or FMM, which enables a fast computation of the matrix-vector product in O (N log N) operations where N is the number of unknowns. The iterative solution yields the unknown current expansion coefficients $c_m$, m=1, . . . , N. The original current and charge distributions on the surface of the target are then determined by introducing these coefficients back into the basis function expansion. Scattered or radiated field of the target including its radar cross-sections is then found by computing the radiation of the already known surface currents and charges at required points in space.

Some approaches do use FMM to solve integral equations (see, e.g., Song & Chew. Multilevel fast-multipole algorithm for solving combined field integral equations of electromagnetic scattering. Microw. Opt. Technol. Lett. 1995 September; 10(1):14-19) but they use custom FMM codes tailored to specific problems. Those custom FMM codes have unknown complexity, accuracy, and limitations. Those custom approaches would also require a high degree of complexity to implement. In contrast, the present invention will implement the general-purpose widely-known and proven FMM algorithm, hereinafter, FMM3D, to solve MFIE, EFIE, and CFIE for scattering and radiation problems in a straightforward, efficient, simple, and reproducible way.

SUMMARY OF THE INVENTION

Methods and systems for obtaining scattering and radiation properties of electrically large metal targets are presented, while improving speed and accuracy of computational electromagnetic modeling environments.

In contrast to prior art, these methods do not employ a custom version of the fast multipole method (FMM) tailored to a specific CEM application. Instead, they are based on the accurate integration of a general-purpose already existing fast multipole method (FMM) algorithm [1], which is equally well applicable to electromagnetic, mechanical, and fluid dynamics problems.

In a preferred embodiment, these methods are based on the integration of the open-source parallelized FMM library, FMM3D originating from the inventors of the FMM and made accessible for commercial use since 2017. This FMM3D library summarizes a more than 20 years long ongoing effort of a group of leading mathematicians. This FMM3D library possesses high performance and speed, which could hardly be surpassed by custom codes.

In a preferred embodiment, these methods are first based on the special formulation and discretization of the magnetic field integral equation (MFIE), which makes the integration with the general-purpose FMM3D possible.

In a preferred embodiment, MFIE is discretized with extended Rao-Wilton-Glisson (RWG) basis functions (Jakobus et al. Improved PO-MM Formulation for Scattering from Three-Dimensional Perfectly Conducting Bodies of Arbitrary Shape. IEEE Trans. Antennas and Propagation, vol. AP-43, no. 2, pp. 162-169, February 1995) shown in FIG. 4. MFIE describes scattering of large smooth closed targets, but a correction may be introduced for sharp edges (Rius et al. On The Testing of the Magnetic Field Integral Equation With RWG Basis Functions in Method of Moments. IEEE Trans. Antennas and Propagation, vol. AP-49, no. 11, pp. 1550-1553, November 2001). In a further embodiment, not the standard Galerkin method but the collocation method is used, with the collocation points coinciding with the centers of RWG basis function edges. In a preferred embodiment, MFIE is multiplied, by forming the dot product, with vectors $t_m^{\pm}$ in plane of two adjacent triangles of the RWG basis functions shown in FIG. 1, which both are perpendicular to the base edge. This operation makes it possible to keep the structure of MFIE as the Fredholm equation of the second kind.

In a further embodiment, to enable the direct and efficient integration of the general-purpose fast multipole method FMM3D for MFIE, three computational steps are made after applying the collocation method:
  i. the sum of integrals over RWG basis functions (over triangles adjacent to edges of the triangular surface mesh) is further replaced by an equivalent sum over individual triangular facets;

ii. the surface integrals of MFIE are computed using the central-point approximation, with all self terms exactly equal to zero.

iii. The cross product of the surface current on a triangular facet and the gradient of Green's function is replaced by three dot products for three sets of effective "dipole moments" and the gradient of the Green's function;

As a result of these three steps, the standard general-purpose FMM3D library (Gimbutas et al. fmm3D Documentation. Release 0.1.0. 2019.) is directly applied to compute the left-hand side of MFIE as a potential of the double layer (the "dipole" layer) three times in parallel.

In a preferred embodiment, these methods are next based on the special formulation and discretization of the electric field integral equation (EFIE) in the mixed-potential formulation, which makes the integration with the general-purpose FMM3D possible.

In a preferred embodiment, EFIE is discretized with the standard Rao-Wilton-Glisson (RWG) basis functions (Rao et al. Electromagnetic Scattering by Surfaces of Arbitrary Shape. IEEE Trans. on Antennas and Propagation. 1982 May; 30(3):409-418). EFIE describes scattering of any metal targets, but it possesses a slow convergence speed since it is a Fredholm equation of the first kind. In a preferred embodiment, the Galerkin method is used to solve EFIE.

To enable the direct and efficient integration of the general-purpose fast multipole method for EFIE, two computational steps are made after applying the Galerkin method:

i. the sums of integrals over RWG basis functions (triangles adjacent to edges of the triangular surface mesh) for the electric scalar potential and the magnetic vector potential are further replaced by an equivalent sum over triangular facets;

ii. the electric scalar potential and the magnetic vector potential of EFIE are computed using the central-point approximation, with the self-terms computed analytically.

As a result of these two steps, the standard general-purpose FMM3D library (Gimbutas et al. fmm3D Documentation. Release 0.1.0. 2019.) is applied to directly compute the electric scalar potential and the magnetic vector potential, and the left-hand side of EFIE as a potential of the single layer (the "charge" layer) four times in parallel.

In a preferred embodiment, EFIE and MFIE are further combined together with a proper weight to form combined field integral equation (CFIE) augmented with the known incident electromagnetic wave. CFIE possesses better convergence and allows to solve resonant problems. CFIE is solved iteratively with the general-purpose FMM3D library applied at every step of the iterative solution as described herein. The intrinsic FMM3D accuracy for surface (not volume) integration can be chosen moderate: 1e-3 to 1e-4 without affecting solution accuracy significantly.

DETAILED DESCRIPTION OF THE INVENTION

I. Overview

Methods and systems are presented for assessing scattering and radiation performance of large metal scattering targets such as an airplane, a ship, a missile, or a large antenna array (Makarov S N, Iyer V, Kulkarni S. Method and system for assessing performance of arbitrarily large arrays. U.S. Pat. No. 10,275,547. Apr. 30, 2019) on a computer, providing more information than can ever be measured in a laboratory or in situ. This is done while improving speed and accuracy of computational electromagnetics modeling environments. Solutions for modeled targets are obtained through use of Method of Moment (MoM) analyses, coupled with the general-purpose fast multipole method. For the purpose of clarity, several embodiments described below are presented in the context of an arbitrary metal target, using triangular surface discretization. But those of skill in the art will recognize that the systems and methods described herein below are applicable to alternative discretization approaches (e.g., rectangular, hexagonal lattice, etc.). In addition, those of skilled in the art will recognize that the principles can also be applied to determining performance characteristics for targets that include dielectric materials.

In some embodiments, the systems and methods are embodied in software stored and executable on one or more computing devices. A user can access the systems and methods using a user device, e.g., a computing device, remotely or locally. For example, the user device can interact with the systems and methods through a network, e.g., the Internet, and can display a user interface, e.g., a webpage, to the user. The user device can also host the systems and methods locally, e.g., by downloading and installing the software on the user device. The models can be constructed using the same systems and methods or different systems and methods that are hosted by the same computing device(s).

Example of Systems

In the example shown in FIG. 1, a client device 110 accesses and interacts with a server device 150 through a network 140 to obtain information about scattering/radiation of a target or choose a target model for use. A user may interact with the client device 110 directly or through one or more input devices 120. The input device(s) 120 can be part of the client device 110 and can be a user device. In some implementations, the client device 110 can provide the desired information without needing to access the server device 150. In some implementations, historical data is provided to the server device 150 or to the client device 110 to generate and process the target models. In some implementations, the server device 150 or the client device 110 does not generate target models. Instead, target models are provided to the server device 150.

The server device 150 hosts a technical computing environment (TCE) 130 in which the historical data is processed and the target models are processed and/or generated. In some implementations, the client device 110 may employ a TCE 130(160) to provide a display, e.g., a webpage. In some implementations, a user interacts with the server device 150 via the displayed webpage. The displayed TCE 130 operating on the client device 110 can be the same as or be part of the TCE 130 hosted by the server device 150. In some implementations, the TCE 160 is hosted on the client device 110. In such implementations, the client device 110 may not need to access the server device 150 to generate and/or process the desired model. Instead, target models can be generated locally at the client device 110 in the TCE 130. The TCE 130 can provide an interface that allows a user to interact with the client device 110 and the server device 150.

The server device 150, the client device 110, and the network 140 can be connected through wired connections, wireless connections, or a combination of wired and wireless connections. Although one client device 110 and one server device 150 are shown, multiple client devices 110 can access one or more server devices 150 through the same network 140 or a different network. In some implementations, one or more server devices 150 host one or more TCEs 130, e.g., using virtual machines. Multiple server devices 150 can be used to execute program code, e.g., serially or in parallel, and may provide respective results of executing the program code to the client device 110.

The client device 110 can include one or more devices capable of receiving, generating, storing, processing, and/or providing program code and/or information associated with program code for a model. For example, the client device 110 includes a computing device, such as a desktop computer, a laptop computer, a tablet computer, a mobile phone (e.g., a smart phone, a radiotelephone, etc.), or a similar device. In some implementations, the client device 110 receives information from and/or transmits information to the server device 150.

The server device 150 may include one or more devices capable of receiving, generating, storing, processing, evaluating, and/or providing program code and/or information associated with program code for a model. Additionally, the server device 150 also includes one or more devices capable of comparing multiple models generated from the same set of historical data. For example, the server device 150 includes a computing device, such as a server, a desktop computer, a laptop computer, a tablet computer, or a similar device.

The network 140 can include one or more wired and/or wireless networks. For example, network 140 includes a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

Referring also to FIG. 2, the TCE 130/160 is supported by an application programming interface (API) 260. The API 260 can be visible to a user within the TCE 130, or can be invisible to the user. In some implementations, the API 260 specifies how portions of programming code implementing different parts of the methods of this disclosure, e.g., generating and/or comparing infinite array models, interact with each other to perform the methods and generate results. An example of a portion of programming code is an optimizer 266 that is capable of optimizing parameters. Other examples of the programming code portions can include, but not limited to, a target model generator, equation solver, and graphical user interface (not shown). The API 260 can receive one or more TCE inputs 262 from the TCE 130, or on behalf of a user or a user device, and output one or more TCE outputs 264 to the TCE 130. Examples of TCE inputs 262 include, for example, specifications for the target models to be processed or generated, incident field data, testing data, etc. Examples of TCE outputs 264 include generated models, results of model comparisons, and other user specified information.

The numbers and arrangements of devices and networks shown in FIGS. 1 and 2 are provided as examples. In practice, there can be additional devices and/or networks, fewer devices and/or networks, different devices and/or networks, or differently arranged devices and/or networks than those shown in the figures. Furthermore, two or more devices shown in the figures can be implemented within a single device, or a single device shown in the figures can be implemented as multiple, distributed devices.

III. Example Implementations of Target Scattered/Radiation Field Estimation

With reference to FIG. 3, the systems of this disclosure, including software stored on the server device 150, the client device 110, TCEs 130/160 of FIGS. 1 and 2, can perform process 300 to generate or acquire target models of the physical target of interest, and solve for the associated scattered/radiated fields and other results. Although a particular sequence is described for the process 300, skilled artisans will appreciate that alternative mathematical approaches may be possible for particular steps. Further it may be possible to perform one or more steps in the process 300 at a different time relative to the other steps and/or in orders other than as shown in FIG. 3.

Initially, upon receipt of a request, step 302 to estimate the performance of a physical target, e.g., from a user or a user device, the system may prompt the user or user device to input information about the target model(s) to be imported or generated, step 304. These inputs can be the same as TCE inputs 262 of FIG. 2. For example, the systems may ask the user to provide input one or more of the following parameters: geometry of the target (triangular surface mesh), excitation signal frequency as well as the phase, and materials design parameters, spatial points of interest for electric and magnetic fields determination, and desired TCE outputs 264 to be generated and/or or displayed. The systems may present, e.g., to the user, choices for options, for one or more of these inputs for selection. In some implementations, the systems interact with the user or the user device dynamically, e.g., in multiple steps, to prompt the user or the user device to provide the required or the missing inputs. The systems may not need to generate the target model from input requirements. Instead, the systems may receive the target model from an external input, e.g., from the user or the user device. When some inputs are not received, the systems may use one or more default parameters and inform the user that a default parameter has been used.

In step 306, the target mesh model is either imported or created internally. FIG. 8A and FIG. 9A illustrate, respectively, examples of possible built-in target models—a metallic sphere and a metallic NASA almond. Once the target model is imported or created, some implementations then begin the model performance estimation process (Step 308.) Mathematical details of certain exemplary implementations of process 308 will be described in much greater detail in Section IV below as including numerous sub-processes. In Step 310, the basis functions (extended RWG basis functions) and their parameters are generated. In Step 312, incident fields are generated for face centers.

Results, such as described above, of the scattered/radiated field estimation process 308 may be output in Step 330. A determination (Step 332) may then be made to determine whether the determined performance characteristics of the physical target meet user's requirements. Typical performance requirements specified for a physical target include monostatic radar cross-section and bi-static radar cross-sections including the frontal lobe, the backlobes and sidelobes. If the requirements are satisfied, the process may then proceed to other target modeling tasks, or progress to prototype development (Step 334). If the performance measures output does not meet the specified requirements, the process may iterate, e.g., from step 332, permitting the user to enter additional and/or different input parameters or change the target mesh, or the system to automatically vary certain input parameters, until the output performance characteristics for the modeled physical antenna array satisfy the requirements.

Sections IV through IX will now describe in detail exemplary solutions for the scattering algorithm with the general purpose fast multipole method, FMM3D, of process 300 including steps 310, 314, 316, 318, 320, 322, 324, 326.

IV. General-Purpose Fast Multipole Method—Steps 316, 324

Let $c_n$ denote a collection of charge strengths, $v_n$ denote a collection of dipole strengths. Let k denote the wavenumber. The Helmholtz FMM3D computes the potential $u(r)$ and its gradient $\nabla u(r)$ given by $$u(r) = \sum_{n=1}^{N} c_n \frac{\exp(jk|r - r_n|)}{|r - r_n|} - v_n \cdot \nabla \left( \frac{\exp(jk|r - r_n|)}{|r - r_n|} \right) \quad (*)$$

at the source and target locations. When $r=r_n$, the term corresponding to $r_n$ is dropped from the sum. When k is negative (i.e. when the exp(jωt) convention is used), a complex conjugate should be applied to Eq. (*) to properly use FMM3D.

V. Extended Rao-Wilton-Glisson Basis Functions Used for GEM Solution Expansion and Extra Numerical Arrays—Step 310

The following notations are introduced: $f_n$—RWG basis functions, $l_n$—edge lengths; $A_n$—triangle areas. RWG vector expansion for surface current density and, simultaneously, scalar expansion for the surface charge density reads with reference to FIG. 1

$$J(r) = \sum_{n=1}^{N} c_n f_n, \quad f_n = \begin{array}{c} \frac{l_n}{2A_n^+} \rho_n^+ \\ \frac{l_n}{2A_n^-} \rho_n^- \end{array}, \quad \nabla_s \cdot f_n = \begin{array}{c} +\frac{l_n}{A_n^+} \\ -\frac{l_n}{2A_n^-} \end{array} \quad (1)$$

Following ((Jakobus et al. Improved PO-MM Formulation for Scattering from Three-Dimensional Perfectly Conducting Bodies of Arbitrary Shape. IEEE Trans. Antennas and Propagation, vol. AP-43, no. 2, pp. 162-169, February 1995)), along with the standard definition, we will require two unit normal vectors $n_n^\pm$ and two unit vectors $t_n^\pm$ also shown in FIG. 1. Vector $t_n^+$ is in the plane of triangle $tr_n^+$, vector $t_n^-$ is in the plane of triangle $tr_n^-$; both vectors are perpendicular to edge $l_n$. They are defined at the center of edge $l_n$, which will be denoted by $r_n$. Directions of $t_n^\pm$ are shown in FIG. 1. It is assumed that the normal vectors are properly (angle between adjacent $n_n^\pm$ must be less than 180 deg) and uniquely defined. Specific vector orientation (e.g. outer or inner normal vectors) does not matter. We then form two cross product denoted by vectors $l_n^\pm$, $$l_n^\pm = t_n^\pm \times n_n^\pm \quad (2)$$

and establish that both such unit vectors directed along the edge are identical, i.e.

$$l_n^+ = l_n^- = l_n \quad (3)$$

Only vector $l_n$ will eventually be needed. Along with the extended RWGs, extra numerical arrays—basis function signatures—will be generated allowing fast transitions to/from currents and charges determined by RWG bases from/to currents and charges on individual facets. Those are
 array containing number of basis functions covering given facet (1, 2, or 3);
 array containing indexes into basis functions covering given facet (up to three indexes);
 signed charge contribution into the given facet charge (without area);
 x-current contribution into the given facet current (without area);
 y-current contribution into the given facet current (without area);
 z-current contribution into the given facet current (without area).

VI. Integration of Magnetic Field Integral Equation (MFIE) and the Standard Fast Multipole Method (FMM3D)—Steps 314, 316

VI.1 Expansion into Basis Functions

In terms of phasors, the magnetic field integral equation for the surface current density $J(r)$ induced by an incident field $H^i(r)$ on the surface of a metal target has the form $$J(r) = 2n(r) \times \int_S J(r') \times \nabla_{r'} \frac{\exp(-jk|r-r'|)}{4\pi|r-r'|} dr' + 2n(r) \times H^i(r) \quad (4)$$

Expanding the current into vector RWG basis functions Eq. (1) with unknown coefficients $c_n$, one has $$\sum_{n=1}^{N_{edges}} c_n f_n = \quad (5)$$

$$2n(r) \times \sum_{n=1}^{N_{edges}} c_n \int_{S(f_n)} f_n(r') \times \nabla_{r'} \frac{\exp(-jk|r-r'|)}{4\pi|r-r'|} dr' + 2n(r) \times H^i(r)$$

VI.2 Application of Collocation Method

The following collocation method is used: choose $$r_m^\pm \to R_m$$

(asymptotically) as the collocation points. In other words, the two collocation points will approach the edge center $R_m$ from both edge sides. Then, the scalar multiplication of both sides of Eq. (5) by $t_m^\pm$ (the dot product) is performed. In this case, only one term on the left-hand side of Eq. (5) will be retained, which corresponds to the m-th basis function, since all other basis functions will be perpendicular to $t_m^\pm$ at this edge. The result becomes $$\frac{l_m}{2A_m^\pm} \rho_m^\pm(r_m^\pm) \cdot t_m^\pm c_m = \quad (6)$$

$$2t_m^\pm \cdot \left\{ n(r_m^\pm) \times \sum_{n=1, n \neq m}^{N_{edges}} c_n \int_{S(f_n)} f_n(r') \times \nabla_{r'} \frac{\exp(-jk|R_m - r'|)}{4\pi|R_m - r'|} dr' \right\}$$

Eq. (6) in fact includes two formally separate equations for ±triangles of the m-th basis function. They will be shown to be identical later on. The self terms (with m=n) on the right-hand side of Eq. (6) are exactly equal to zero since the inner cross product is in the direction of the normal vector $n(r_m^\pm)$. Using the vector identity $A \cdot (B \times C) = C \cdot (A \times B)$ with $A=t_m^{\pm}$, $B=n(r_m^{\pm})$, and taking into account Eqs. (2) and (3), we obtain the following result for the primary field in Eq. (6), $$l_m^{PO} = t_m^{\pm} \cdot 2n(r_m^{\pm}) \times H^i(r_m^{\pm}) = 2H^i(r_m^{\pm}) \cdot (t_m^{\pm} \times n(r_m^{\pm})) = 2l_m \cdot H^i(R_m) \quad (7)$$

The same vector identity is applied and the same method to transform the right-hand side of Eq. (6). Lastly, the factor $$\frac{l_m}{2A_m^{\pm}} \rho_m^{\pm}(r_m^{\pm}) \cdot t_m^{\pm}$$

on the left-hand side of Eq. (6) is the normal component of the RWG basis function across the base edge; it is exactly equal to one ((Rao et al. Electromagnetic Scattering by Surfaces of Arbitrary Shape. IEEE Trans. on Antennas and Propagation. 1982 May; 30(3):409-418)). Eq. (6) is therefore rewritten in a simpler form:

$$c_m = 2\left\{l_m \cdot \sum_{n=1, n \neq m}^{N_{edges}} \left(\int_{S(f_n)} f_n(r') \times \nabla_{r'} \frac{\exp(-jk|R_m - r'|)}{4\pi|R_m - r'|} dr'\right) c_n\right\} + I_m^{PO} \quad (8)$$

Eq. (8) is now one single equation irrespective of the fact from which side (plus or minus triangle) the collocation point approaches the edge center $R_m$.

VI.3 Conversion to Integration Over Facets

With all other quantities unchanged, the sum over the mesh edges in Eq. (8) can be transformed to the sum over the triangular facets themselves as follows $$c_m = \qquad (9)$$
$$2\left\{l_m \cdot \sum_{n=1}^{N_{facets}} \left(\int_{S(f_n)} J_n(r') \times \nabla_{r'} \frac{\exp(-jk|R_m - r'|)}{4\pi|R_m - r'|} dr'\right) c_n\right\} + I_m^{PO}$$

where $$J_n = \sum_{q=1}^{3} f_q(r') c_q \quad (10)$$

is the sum of the contributions of three basis functions sharing the same n-th triangle. Triangles, which belong to basis function $f_m$ in Eq. (9), will automatically give zero contribution.

VI.4 Integral Approximation

The central-point approximation is used for all integrals in Eq. (9) yielding $$c_m = \left\{l_m \cdot \sum_{n=1}^{N_{facets}} I_n \times \nabla_{r'} \frac{\exp(-jk|R_m - r_n|)}{4\pi|R_m - r_n|}\right\} + I_m^{PO} \quad (11)$$

where $r_n$ are triangle centroids and, after taking gradient of the Green's function, r' is replaced by $r_n$. Furthermore, $$I_n = \sum_{q=1}^{3} l_q \rho_q^{\pm}(r_n) c_q \quad (12)$$

VI.5 Conversion of Cross Product to Three Dot Products

Eq. (11) is finally rewritten in the form (the gradient operation is the same as above)

$$c_m = \left\{l_m \cdot \sum_{n=1}^{N_{facets}} \begin{pmatrix} M_1 \cdot \nabla \\ M_2 \cdot \nabla \\ M_3 \cdot \nabla \end{pmatrix} \frac{\exp(-jk|R_m - r_n|)}{4\pi|R_m - r_n|}\right\} = I_m^{PO} \quad (13)$$

with $$M_1 = \begin{pmatrix} 0 \\ -m_z \\ +m_y \end{pmatrix}, M_2 = \begin{pmatrix} +m_z \\ 0 \\ -m_x \end{pmatrix}, M_3 = \begin{pmatrix} -m_y \\ +m_x \\ 0 \end{pmatrix}, m = I_n(r_n) \quad (14)$$

Eqs. (13), (14) are proved by direct substitution.

VI.6 Application of the General-Purpose FMM3D

Eqs. (13), (14) enable us to compute the sum on the left-hand side of Eq. (13) by using the FMM3D Eq. (*) directly, i.e. by computing (in the vectorized form) potentials of three dipole layers with strengths $M_1, M_2, M_3$. FMM3D's target points are centers of mesh edges $R_m$ while FMM3D's source points are triangle centroids $r_n$.

In order to form the effective current in Eq. (12), one ay pre-compute:

1. Array of basis function indexes ($N_{facets} \times 3$) covering every facet n;
2. Array of vectors $\rho_q^{\pm}$ for the basis functions covering every facet n.

VI.7 Variations of the General-Purpose FMM3D

Integrals (13) for the centers of mesh edges $R_m$ may be approximated as a half sum of the integrals computed for the centers of adjacent triangles $r_m^{\pm}$. This operation can be straightforwardly implemented into FMM3D. Alternatively, integrals (13) for the centers of mesh edges $R_m$ may be approximated as a half sum of the integrals computed for the corners of the edge. This operation can be straightforwardly implemented into FMM3D.

VI.8 Near-Field Integrals—Step 318

The near-field integrals in Eq. (9) may be computed analytically as described in (Wang et al. Comparison of semi-analytical formulations and Gaussian-quadrature rules for quasi-static double-surface potential integrals. IEEE Antennas and Propagation Magazine. 2003 December; 45(6):96-102) and then substituted into the final expression Eq. (13). This substitution is equivalent to the replacement of a single term in the sum in Eq. (13) by its averaged version.

VI.9. Units

Both sides of all equations starting with Eq. (4) and up to Eq. (13) have the units of amperes per meter.

VI.10. Example of Integration of General-Purpose FMM3D and MFIE

FIG. 5 shows the code for computation of the left-hand side of MFIE with the general-purpose FMM3D in MAT-LAB® environment.

VII. Integration of Electric Field Integral Equation (EFIE) and the General-Purpose Fast Multipole Method FMM3D—Steps 322-324

VII.1 Expansion into Basis Functions

The electric field integral equation on the surface of a metal target has the form:

$$E_t^s = -E_t^i \quad (15)$$

where index t denotes the tangential component of the electric field on the surface, index s means scattered field, and index i—incident field. For the scattered field and in terms of electric scalar potential $\varphi$ and magnetic vector potential A, one has $$E^s(r) = -j\omega A - \nabla\varphi \quad (16)$$

VII.2 Application of Galerkin Method

Instead of the collocation method, the Galerkin method will be applied with testing functions in the form of RWG basis functions, that is $$j\omega \int_{S(f_m)} f_m(r') \cdot A(r') dr' + \int_{S(f_m)} f_m(r') \cdot \nabla\varphi(r') dr' = \int_{S(f_m)} f_m(r') \cdot E^i(r') dr' \quad (17)$$

Integration by parts with taking into account the properties of RWG functions, yields $$j\omega \int_{S(f_m)} f_m(r') \cdot A(r') dr' - \int_{S(f_m)} \nabla \cdot f_m(r') \cdot \varphi(r') dr' = \int_{S(f_m)} f_m(r') \cdot E^i(r') dr' \quad (18)$$

VII.3 Integral Approximation

Using the central-point integration approximation (at triangle centers $r_m^\pm$) everywhere except for the self integrals as well as the definition of RWG basis functions, one has $$j\omega \left\{ \frac{l_m}{2} \rho_m^+(r_m^+) \cdot A(r_m^+) + \frac{l_m}{2} \rho_m^-(r_m^-) \cdot A(r_m^-) \right\} - \{l_m\varphi(r_m^-) - l_m\varphi(r_m^+)\} = V_m \quad (19)$$

where $$V_m = \frac{l_m}{2} \rho_m^+(r_m^+) \cdot E^i(r_m^+) + \frac{l_m}{2} \rho_m^-(r_m^-) \cdot E^i(r_m^-) \quad (20)$$

VII.4 Conversion to Integration Over Facets

With all other quantities unchanged and using the central-point approximation, we can compute the magnetic vector potential and the electric scalar potential in Eq. (19) as follows (three times the potential of a single layer)

$$A(r_m) = \mu_0 \sum_{n=1}^{N_{facets}} \frac{\exp(-jk|r_m - r_n|)}{4\pi|r_m - r_n|} I_n \quad (21)$$

and in the form (the potential of the single layer)

$$\varphi(r) = \frac{1}{\varepsilon_0} \sum_{n=1}^{N_{facets}} \frac{\exp(-jk|r_m - r_n|)}{4\pi|r_m - r_n|} \sigma_n \quad (22)$$

Here, the surface current density $I_n$ at the center of facet n is given by Eq. (12). The surface charge density $\sigma_n$ on facet n is given by (this is an exact relation, without any approximation)

$$\sigma_n = \frac{j}{\omega} \sum_{q=1}^{3} l_q c_q \quad (23)$$

VII.5 Application of the General-Purpose FMM3D

Eqs. (21), (22) enable us to use the general-purpose fast multipole method FMM3D Eq. (*) directly, by computing (in the vectorized form i.e. in parallel) potentials of four single layers with effective charges $I_{nx}$, $I_{ny}$, $I_{nz}$, $\sigma_n$. FMM's target and source points now coincide: they are triangle centroids $r_n$.

In order to form the facet current in Eq. (12) and facet charge in Eq. (23), one may pre-compute:
1. Array of basis function indexes ($N_{facets} \times 3$) covering every facet n;
2. Array of vectors $\rho_q^\pm$ for the basis functions covering every facet n.
3. Array of edges $l_q$ for the basis functions covering every facet n.

VII.6 Near-Field Integrals—Step 326

The near-field integrals in Eqs. (18) may be computed analytically as described in (Wang et al. Comparison of semi-analytical formulations and Gaussian-quadrature rules for quasi-static double-surface potential integrals. IEEE Antennas and Propagation Magazine. 2003 December; 45(6):96-102) and then substituted into the final expressions Eq. (21) and Eq. (22). This substitution is equivalent to the replacement of a single term in the sum in Eq. (21) or (22) by its averaged version.

VII.7. Units

Both sides of all equations starting with Eq. (15) and up to Eq. (20) have the units of volts per meter.

VII.8. Example of Integration of General-Purpose FMM3D and EFIE

FIG. 6 shows the code for computation of the left-hand side of EFIE with the general-purpose FMM3D in MAT-LAB® environment.

VIII. Integration of Combined Field Integral Equation (CFIE) and the General-Purpose Fast Multipole Method FMM3D—Step 320

VIII.1 CFIE

The left-hand side of Eq. (13) is denoted by $LHSH_m$ and the left-hand side of Eq. (19) by $LHSE_m$. The combined field integral equation (CFIE) has the form $$\alpha LHSE_m + (1-\alpha)\eta LHSH_m = \alpha V_m (1-\alpha)\eta l_m^{PO} \qquad (24)$$

where $\alpha$ is a dimensionless constant and $\eta = 376.73\Omega$ is the impedance of free space. The value for $\alpha$ is ½. Both sides of Eq. (24) have the units of volts per meter.

VIII.2 Application of the General-Purpose FMM3D—Step 320

The fast multipole is applied to compute the left-hand side of Eq. (24) multiple times as described above. This results in (i) computing the potential of the single layer four times in Eqs. (21) and (22) and, (iii) computing the potential of the double layer three times in Eq. (13). These computations use the same FMM3D space partitioning and can be performed in a batch mode.

IX. Iterative Solution—Step 320

The iterative solution can be accomplished using Generalized Minimum Residual Method or GMRES. A diagonal preconditioner can be applied to Eq. (24).

FIG. 7 shows the example code for computation of the left-hand side of CFIE and implementation of the general-purpose FMM in MATLAB® environment. It also shows the example of use of GMRES in MATLAB® environment, As used herein in relation to computing, the term component is intended to be broadly construed as hardware, firmware, and/or a combination of hardware and software.

Program code, referred to herein as code or program code, is to be broadly interpreted to include text-based code that may not require further processing to execute (e.g., C or C++ code, Hardware Description Language (HDL) code, very-high-speed integrated circuits (VHSIC) HDL (VHDL) code, Verilog code, Java code, another type of hardware and/or software based code that may be compiled and/or synthesized, etc.), binary code that may be executed (e.g., executable files that may be directly executed by an operating system, bitstream files that may be used to configure an FPGA, Java byte code, object files combined together with linker directives, source code, makefiles, etc.), text files that may be executed in conjunction with other executables (e.g., Python text files, Octave files, MATLAB files, a collection of dynamic-link library (DLL) files with text-based combining, configuration information that connects pre-compiled modules, an extensible markup language (XML) file describing module linkage, etc.), graphical design models that may be executed in conjunction with other executables (e.g., LabView models, SystemVue models, Simulink models, Ptolemy models), source code (e.g., readable by a human), machine code (e.g., readable by a machine), or the like. In some implementations, program code may include different combinations of the above-identified classes of code (e.g., text-based code, graphical models, binary code, text files, source code, machine code, etc.). Additionally, or alternatively, program code may include code generated using a dynamically-typed programming language (e.g., the M language, a MATLAB® language, a MATLAB-compatible language, a MATLAB-like language, etc.) that may be used to express problems and/or solutions using mathematical notations. Additionally, or alternatively, program code may be of any type, such as a function, a script, an object, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

Headings used herein are intended as aids for readability and should not be used to interpret or construe aspects of the technology or claims.

BRIEF DESCRIPTION OF THE DRAWINGS

FIG. 5. Computation of the left-hand side of MFIE with the general-purpose fast multipole method in MATLAB® environment.

FIG. 6. Computation of the left-hand side of EFIE with the general-purpose fast multipole method in MATLAB® environment.

FIG. 7. Computation of the left-hand side of CFIE with the general-purpose fast multipole method and using GMRES in MATLAB® environment.

FIG. 8. Computational performance of the method of this disclosure for perfectly-conducting sphere.

DETAILED DESCRIPTION OF THE DRAWINGS

Figure 1:
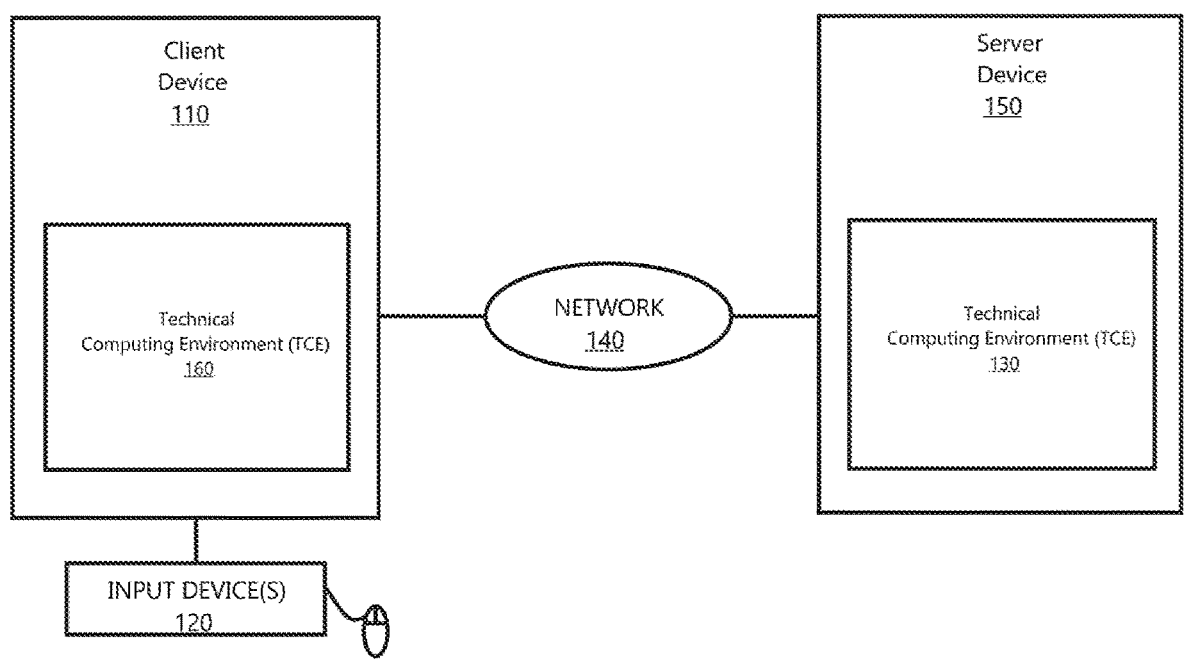
FIG. 1. Block diagram showing an example of the systems of this disclosure.

FIG. 1 shows the system example, a client device 110 accesses and interacts with a server device 150 through a network 140 to obtain information about scattering/radiation of a target or choose a target model for use. A user may interact with the client device 110 directly or through one or more input devices 120. The input device(s) 120 can be part of the client device 110 and can be a user device. In some implementations, the client device 110 can provide the desired information without needing to access the server device 150. The server device 150 hosts a technical computing environment (TCE) 130 in which the historical data is processed and the target models are processed and/or generated. In some implementations, the client device 110 may employ a TCE 130 to provide a display, e.g., a webpage. In some implementations, a user interacts with the server device 150 via the displayed webpage. The displayed TCE 130 operating on the client device 110 can be the same as or be part of the TCE 130 hosted by the server device 150.

Figure 2:
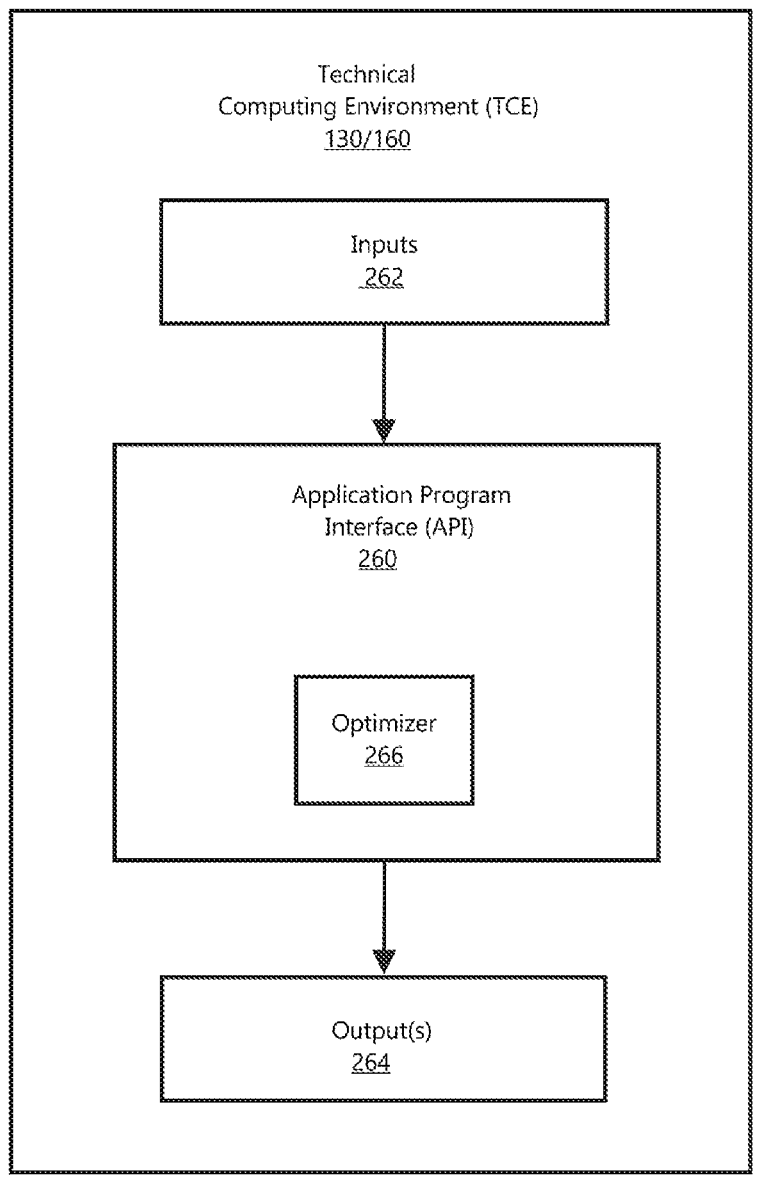
FIG. 2. Block diagram showing an example of a technical computing environment of this disclosure.

FIG. 2 shows block diagram showing an example of a technical computing environment of this disclosure. The TCE 130 is supported by an application programming interface (API) 260. The API 260 can be visible to a user within the TCE 130, or can be invisible to the user. An example of a portion of programming code is an optimizer 266 that is capable of optimizing parameters. Other examples of the programming code portions can include, but not limited to, a target model generator, equation solver, and graphical user interface (not shown). The API 260 can receive one or more TCE inputs 262 from the TCE 130, or on behalf of a user or a user device, and output one or more TCE outputs 264 to the TCE 130. Examples of TCE inputs 262 include, for example, specifications for the target models to be processed or generated, incident field data, testing data, etc. Examples of TCE outputs 264 include generated models, results of model comparisons, and other user specified information.

Figure 3:
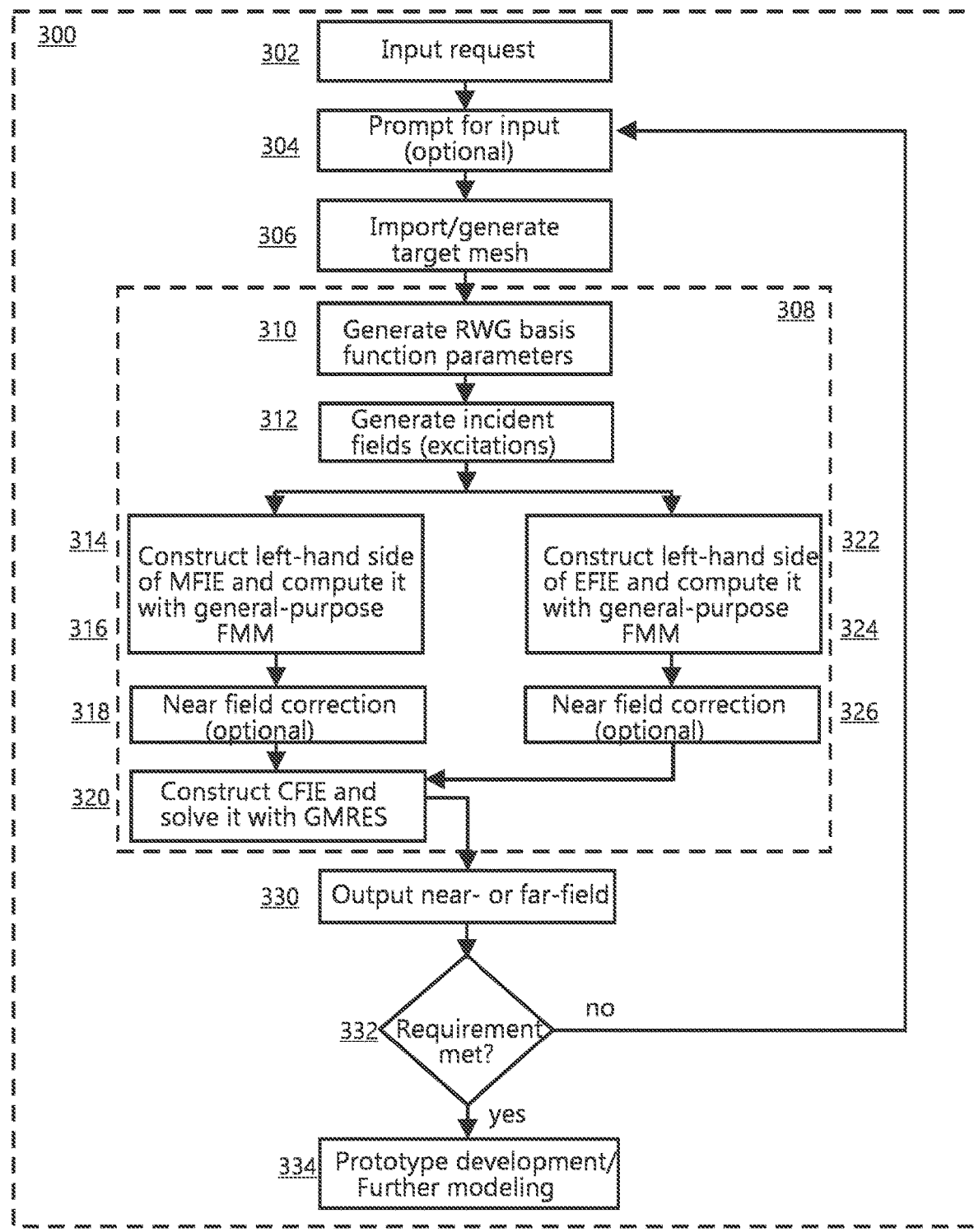
FIG. 3. Flow diagram of an example process for estimating performance of an electrically large scattering/radiation target.

FIG. 3 shows flow diagram of an example process for estimating performance of an electrically large scattering/radiation target. The systems of this disclosure can perform process 300 to generate or acquire target models of the physical target of interest, and solve for the associated scattered/radiated fields and other results. Initially, upon receipt (Step 302) of a request to estimate the performance of a physical target, e.g., from a user or a user device, the systems may prompt (Step 304) the user or user device to input information about the target model(s) to be imported or generated. In step 306, the target mesh model is either imported or created internally. Once the target model is imported or created, some implementations then begin the model performance estimation process (Step 308). In Step 310, the basis functions (extended RWG basis functions) and their parameters are generated. In Step 312, incident fields are generated for face centers. Then, the computations are performed (Steps 314, 322, 318, 326). Results of the scattered/radiated field estimation process 308 may be output in Step 330. A determination (Step 332) may then be made to determine whether the determined performance characteristics of the physical target meet user's requirements. If the requirements are satisfied, the process may then proceed to other target modeling tasks, or progress to prototype development (Step 334). If the performance measures output does not meet the specified requirements, the process may iterate, e.g., from step 332, permitting the user to enter additional and/or different input parameters or change the target mesh, or the system to automatically vary certain input parameters, until the output performance characteristics for the modeled physical antenna array satisfy the requirements.

Figure 4:
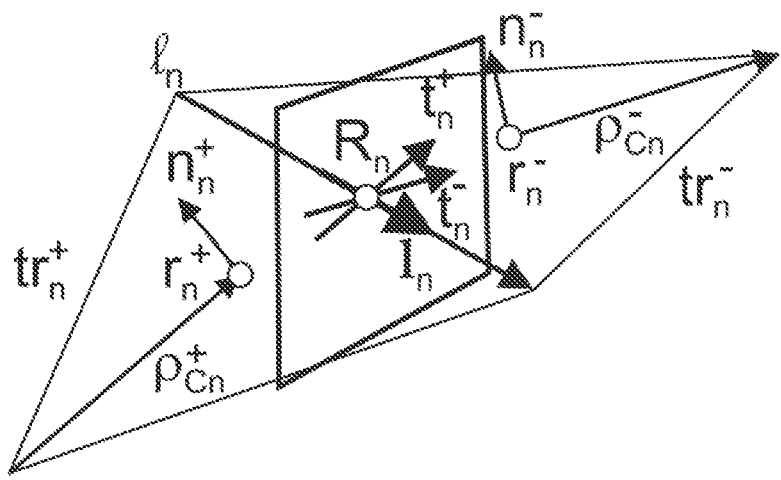
FIG. 4. RWG basis functions used in this method and necessary additions. Vectors $\rho_n^{\pm}$ are shown for triangle centers, $r_n^{\pm}$. Directions of $t_m^{\pm}$ are shown.

FIG. 4 shows RWG basis functions used in this method and necessary additions. Vectors $\rho_n^\pm$ are shown for triangle centers, $r_n^\pm$. Directions of $t_n^\pm$ are shown. These linear basis functions include two triangles sharing a common edge. For non-manifolds topologies, the situation remains the same.

FIG. 5 shows a computation routine for the left-hand side of MFIE with the general-purpose fast multipole method in MATLAB® environment. The code is vectorized. We first find currents/charges for individual facets, then apply the FMM3D three times for the potential of the double layer in parallel, then find the left-hand side of MFIE with angle correction.

FIG. 6 shows a computation routine for the left-hand side of EFIE with the general-purpose fast multipole method in MATLAB® environment. The code is vectorized. We first find currents/charges for individual facets, then apply the FMM3D four times for the potential of the single layer in parallel, then find the left-hand side of EFIE with the analytical calculation of self-integrals.

FIG. 7 shows a computation routine for the left-hand side or LHS of CFIE with the general-purpose fast multipole method and using GMRES in MATLAB® environment. MFIE (after multiplication with the impedance of free space) and EFIE are combined with certain weights and the diagonal preconditioner computed previously is then applied.

FIG. 8 shows computational performance of the method of this disclosure for 11 perfectly-conducting spheres of different resolutions with an extremely high mesh quality (about 0.99 in average when defined as twice the radius of incircle divided by the radius of circumcircle). The ka values range from approximately 3 to approximately 200. The number of elements per wavelength and the number of iterations necessary to reach the relative residual of 1e-3 are shown, along with the relative surface current error as compared with the analytical solution (2-norm) and execution times in minutes for an Intel 2.4 GHz multicore server.

Figure 9:
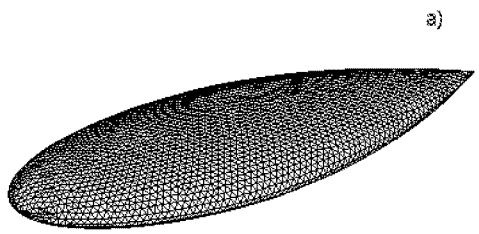
FIG. 9. Computational performance of the method of this disclosure for perfectly-conducting NASA Almond.

FIG. 9 shows computational performance of the method of this disclosure for 7 perfectly-conducting models of the NASA almond of different resolutions with a high mesh quality. The ka values computed for the largest dimension (the largest dimension times k over 2) range from approximately 2 to approximately 130. The number of elements per wavelength and the number of iterations necessary to reach the relative residual of 1e-3 are shown, along execution times in minutes for an Intel 2.4 GHz multicore server.

I claim:

1. A method for computing one or more surface current distributions and one or more surface charge distributions corresponding to a surface of a radar target subject to an incident electromagnetic wave, the radar target comprising metal and the method comprising:
   (a) outputting a first prompt for a user to provide one or more inputs corresponding to one or more electromagnetic waves incident upon the radar target;
   (b) receiving the one or more inputs;
   (c) determining whether the one or more inputs lacks one or more required inputs;
   (d) in response to determining the one or more inputs lacks the one or more required inputs, outputting a second prompt for the user to provider the one or more required inputs and/or outputting a notification indicating that a corresponding default parameter is being used for each of the one or more required inputs;
(e) generating, based at least in part on the one or more inputs, a set of extended Rao-Wilton-Glisson (RWG) basis functions for the surface of the radar target;
(f) generating extra numerical arrays allowing a transition to and/or from the one or more surface current distributions and the one or more surface charge distributions determined by the set of RWG basis functions from and/or to the one or more surface current distributions and the one or more surface charge distributions on a plurality of individual facets for applying one or more fast multipole methods in three dimensions (FMM3D);
(g) computing by one or more processors a left-hand side of a magnetic field integral equation by directly applying the one or more FMM3D;
(h) computing by one or more processors the left-hand side of an electric field integral equation by directly applying the one or more FMM3D;
(i) combining the left-hand side of the magnetic field integral equation and the left-hand side of the electric field integral equations into a combined field integral equation and solving this combined field integral equation iteratively by directly applying the one or more FMM3D at every iteration step, wherein applying the one or more FMM3D comprises:
enabling direct integration of the FMM3D with a certain intrinsic accuracy;
applying the certain intrinsic accuracy of the FMM3D; and
solving the resulting integral equation iteratively using a proper iterative method;
(j) determining the one or more surface current distributions and the one or more surface charge distributions on the surface of the radar target;
(k) determining a scattered field or a radiated field of the radar target using the current and charge distributions;
(l) in response to determining that the scattered field or the radiated field does not satisfy one or more field requirements, iteratively repeating steps (b)-(h) with one or more subsequent inputs until the scattered field or the radiated field satisfies the one or more field requirements; and
(m) in response to the scattered field or the radiated field satisfying the one or more field requirements, outputting for display generated model data indicative of the scattered field or the radiated field.

2. The method of claim 1 further comprising:
solving the left-hand side of the magnetic field integral equation using a collocation method with a plurality of collocation points chosen at edge centers of a triangular surface mesh;
replacing a sum of integrals over the set of RWG basis functions in the left hand side of the magnetic field equation by an equivalent sum over a set of individual triangular facets;
computing a plurality of surface integrals of the left side magnetic field equation using a central point approximation, wherein all self-terms are equal to zero;
replacing a cross product of the at least one surface current on a triangular facet and a gradient of Green's function by three dot products for three sets of "effective "dipole moments" and the gradient of Green's function; and
enabling direct integration of FMM3D into magnetic field integral equation.

3. The method of claim 2 further comprising:
computing the left hand side of the magnetic field integral equations as the potential of three distinct double layers by applying the fast multipole method in parallel; and
effectively reusing information about space partition of the FMM3D.

4. The method of claim 2 further comprising:
a correction of diagonal terms of the magnetic field integral equation by a deviation of the solid angle between two adjacent facets from 180 degrees.

5. The method of claim 1 further comprising:
using a Galerkin method to solve the electric field integral equation in a mixed potential form, including an electric scalar potential and a magnetic vector potential;
replacing the sums of integrals over RWG basis functions, triangles adjacent to edges of a triangular surface mesh, for the electric scalar potential and the magnetic vector potential by an equivalent sum over triangular facets;
computing the electric scalar potential and the magnetic vector potential of the electric field integral equation using a central-point approximation, with self-terms computed analytically; and
enabling direct integration of FMM3D into the electric field integral equation.

6. The method of claim 5 further comprising:
computing the left hand side of the electric field integral equations as a potential of four distinct single layers by applying the fast multipole method in parallel; and
effectively reusing information about space partition of the FMM3D.

7. The method of claim 1 further comprising:
combining the electric field integral equation with the units of volts per meter and the magnetic field integral equation with the units of amperes per meter by multiplying the magnetic field integral equation by an impedance of free space, 377 ohms; and
adding the electric field integral equation and the magnetic field integral equation together with an equal weight equal of ½.

8. The method of claim 7 further comprising:
computing near-field integrals over triangular facets in the magnetic field integral equation analytically, except for zero self terms, and replacing the corresponding contributions of the FMM3D; and
computing near-field potential integrals over triangular facets in the electric field integral equation analytically, including self-terms, and replacing the corresponding contributions of the FMM3D.

9. The method of claim 2 further comprising replacing a collocation integral value in the magnetic field integral equation by an averaged value of two integrals over two adjacent triangles.

10. The method of claim 1 further comprising choosing an intrinsic FMM3D accuracy for surface (not volume) integration moderate: the values 1e-3 to 1e-4 may be used without affecting solution accuracy significantly.

11. The method of claim 1 further comprising a preconditioner for the combined field integral equation.

12. The method of claim 8 further comprising using barycentric subdivision of all triangular facets of a triangular surface mesh for increased FMM3D accuracy instead of computing near-field integrals.

13. The method of claim 11 further comprising a simple diagonal preconditioner for the combined field integral equation.

14. The method of claim 1, wherein the radar target comprises a plurality of target shapes and compositions, each of the plurality of target shapes and compositions including a pure metal component and a dielectric component.

15. A tangible, non-transitory computer-readable medium storing instructions, the instructions when read by one or more processors, cause the one or more processors to:
(a) outputting a first prompt for a user to provide one or more inputs receiving one or more inputs corresponding to one or more electromagnetic waves incident upon a radar target;
(b) receiving the one or more inputs;
(c) determining whether the one or more inputs lacks one or more required inputs;
(d) in response to determining the one or more inputs lacks the one or more required inputs, outputting a second prompt for the user to provider the one or more required inputs and/or outputting a notification indicating that a corresponding default parameter is being used for each of the one or more required inputs;
(e) generating, based at least in part on the one or more inputs, a set of extended Rao-Wilton-Glisson (RWG) basis functions for a surface of the radar target;
(f) generating extra numerical arrays allowing a transition to and/or from one or more surface current distributions and one or more surface charge distributions determined by the set of RWG basis functions from and/or to the one or more surface current distributions and the one or more surface charge distributions on a plurality of individual facets for applying one or more fast multipole methods in three dimensions (FMM3D);
(g) computing by one or more processors a left-hand side of a magnetic field integral equation by directly applying the one or more FMM3D;
(h) computing by one or more processors the left-hand side of an electric field integral equation by directly applying the one or more FMM3D;
(i) combining the left-hand side of the magnetic field integral equation and the left-hand side of the electric field integral equations into a combined field integral equation and solving this combined field integral equation iteratively by directly applying the one or more FMM3D at every iteration step, wherein applying the one or more FMM3D comprises:
enabling direct integration of the FMM3D with a certain intrinsic accuracy;
applying the certain intrinsic accuracy of the FMM3D; and
solving the resulting integral equation iteratively using a proper iterative method;
(j) determining the one or more induced surface current distributions and the one or more surface charge distributions on the surface of the radar target;
(k) determining a scattered field or a radiated field of the radar target using the current and charge distributions; and
(l) in response to determining that the scattered field or the radiated field does not satisfy one or more field requirements:
automatically varying at least one of the one or more inputs to generate one or more subsequent inputs; and
automatically repeating steps (b)-(h) with the one or more subsequent inputs until the scattered field or the radiated field satisfies the one or more field requirements.

16. The tangible, non-transitory computer-readable medium of claim 15, wherein the one or more instructions, when read by the one or more processors, further cause the one or more processors to optimize scattering performance of the radar target.

17. A system comprising:
a metal radar target; and
a device comprising one or more processors configured to:
(a) output a first prompt for a user to provide one or more inputs regarding the metal radar target, the one or more inputs including one or more of: a triangular surface mesh of the metal radar target, an excitation signal frequency, an excitation signal phase, material parameters of the metal radar target, or spatial points of interest on the metal radar target for electric and magnetic fields determination;
(b) receive the one or more inputs;
(c) determine whether the one or more inputs lacks one or more required inputs;
(d) in response to determining the one or more inputs lacks the one or more required inputs, output a second prompt for the user to provider the one or more required inputs and/or outputting a notification indicating that a corresponding default parameter is being used for each of the one or more required inputs;
(e) generate, based at least in part on the one or more inputs, a set of extended Rao-Wilton-Glisson (RWG) basis functions for the surface of the metal radar target;
(f) generate extra numerical arrays allowing a transition to and/or from one or more surface current distributions and one or more surface charge distributions determined by the set of RWG basis functions from and/or to the one or more surface current distributions and the one or more surface charge distributions on a plurality of individual facets for applying one or more fast multipole methods in three dimensions (FMM3D);
(g) compute, by one or more processors, a left-hand side of a magnetic field integral equation by directly applying the one or more FMM3D further comprising:
using a collocation method with a plurality of collocation points chosen at edge centers of a triangular surface mesh;
replacing a sum of integrals over the set of RWG basis functions in the left hand side of the magnetic field equation by an equivalent sum over a set of individual triangular facets;
computing a plurality of surface integrals of the left side magnetic field equation using a central point approximation, wherein all self-terms are equal to zero;
replacing a cross product of the at least one surface current on a triangular facet and a gradient of Green's function by three dot products for three sets of "effective "dipole moments" and the gradient of Green's function; and
enabling direct integration of FMM3D into magnetic field integral equation;
(h) compute by one or more processors the left-hand side of an electric field integral equation by directly applying the one or more FMM3D;
(i) combine the left-hand side of the magnetic field integral equation and the left-hand side of the electric field integral equations into a combined field integral equation and solving this combined field integral equation iteratively by directly applying the one or more FMM3D at every iteration step; and (i) determine a scattered field or a radiated field of the metal radar target using the current and charge distributions.

18. The system of claim 17, wherein the metal radar target comprises a plurality of target shapes and compositions, each of the plurality of target shapes and compositions comprising a pure metal component and a dielectric component.

19. A method for computing one or more surface current distributions and one or more surface charge distributions corresponding to a surface of a radar target subject to an incident electromagnetic wave, the radar target comprising metal and the method comprising:

(a) outputting a first prompt for a user to provide receiving one or more inputs corresponding to one or more electromagnetic waves incident upon the radar target;

(b) receiving the one or more inputs;

(c) determining whether the one or more inputs lacks one or more required inputs;

(d) in response to determining the one or more inputs lacks the one or more required inputs, outputting a second prompt for the user to provider the one or more required inputs and/or outputting a notification indicating that a corresponding default parameter is being used for each of the one or more required inputs;

(e) generating, based at least in part on the one or more inputs, a set of extended Rao-Wilton-Glisson (RWG) basis functions for the surface of the radar target;

(f) generating extra numerical arrays allowing a transition to and/or from the one or more surface current distributions and the one or more surface charge distributions determined by the set of RWG basis functions from and/or to the one or more surface current distributions and the one or more surface charge distributions on a plurality of individual facets for applying one or more fast multipole methods in three dimensions (FMM3D);

(g) computing, by one or more processors, a left-hand side of a magnetic field integral equation by directly applying the one or more FMM3D further comprising:
using a collocation method with a plurality of collocation points chosen at edge centers of a triangular surface mesh;
replacing a sum of integrals over the set of RWG basis functions in the left hand side of the magnetic field equation by an equivalent sum over a set of individual triangular facets;
computing a plurality of surface integrals of the left side magnetic field equation using a central point approximation, wherein all self-terms are equal to zero;
replacing a cross product of the at least one surface current on a triangular facet and a gradient of Green's function by three dot products for three sets of "effective "dipole moments" and the gradient of Green's function; and
enabling direct integration of FMM3D into magnetic field integral equation;

(h) computing by one or more processors the left-hand side of an electric field integral equation by directly applying the one or more FMM3D;

(i) combining the left-hand side of the magnetic field integral equation and the left-hand side of the electric field integral equations into a combined field integral equation and solving this combined field integral equation iteratively by directly applying the one or more FMM3D at every iteration step;

(j) determining a scattered field or a radiated field of the radar target using the current and charge distributions;

(k) in response to determining that the scattered field or the radiated field does not satisfy one or more field requirements, iteratively repeating steps (b)-(h) until the scattered field or the radiated field satisfies the one or more field requirements; and (l) in response to the scattered field or the radiated field satisfying the one or more field requirements, outputting for display results indicative of a comparison of the scattered field or the radiated field to the one or more field requirements.

20. A method for computing one or more surface current distributions and one or more surface charge distributions corresponding to a surface of a radar target subject to an incident electromagnetic wave, the radar target comprising metal and the method comprising:

(a) outputting a first prompt for a user to provide one or more inputs corresponding to one or more electromagnetic waves incident upon the radar target;

(b) receiving the one or more inputs;

(c) determining whether the one or more inputs lacks one or more required inputs;

(d) in response to determining the one or more inputs lacks the one or more required inputs, outputting a second prompt for the user to provider the one or more required inputs and/or outputting a notification indicating that a corresponding default parameter is being used for each of the one or more required inputs;

(e) generating, based at least in part on the one or more inputs, a set of extended Rao-Wilton-Glisson (RWG) basis functions for the surface of the radar target;

(f) generating extra numerical arrays allowing a transition to and/or from the one or more surface current distributions and the one or more surface charge distributions determined by the set of RWG basis functions from and/or to the one or more surface current distributions and the one or more surface charge distributions on a plurality of individual facets for applying one or more fast multipole methods in three dimensions (FMM3D);

(g) computing by one or more processors a left-hand side of a magnetic field integral equation by directly applying the one or more FMM3D;

(h) computing by one or more processors the left-hand side of an electric field integral equation by directly applying the one or more FMM3D further comprising:
using a Galerkin method to solve the electric field integral equation in a mixed potential form, including an electric scalar potential and a magnetic vector potential;
replacing the sums of integrals over RWG basis functions, triangles adjacent to edges of a triangular surface mesh, for the electric scalar potential and the magnetic vector potential by an equivalent sum over triangular facets;
computing the electric scalar potential and the magnetic vector potential of the electric field integral equation using a central-point approximation, with self-terms computed analytically; and
enabling direct integration of FMM3D into the electric field integral equation;

(i) combining the left-hand side of the magnetic field integral equation and the left-hand side of the electric field integral equations into a combined field integral equation and solving this combined field integral equation iteratively by directly applying the one or more FMM3D at every iteration step;

(j) determining a scattered field or a radiated field of the radar target using the current and charge distributions;

(k) in response to determining that the scattered field or the radiated field does not satisfy one or more field requirements, iteratively repeating steps (b)-(h) until the scattered field or the radiated field satisfies the one or more field requirements; and (l) outputting instructions for prototype development based at least in part on the scattered field or the radiated field that satisfies the one or more field requirements.

\* \* \* \* \*